(12) United States Patent
Lee (10) Patent No.: US 10,678,390 B2
(45) Date of Patent: Jun. 9, 2020

(54) DISPLAY DEVICE

(71) Applicant: Samsung Display Co., Ltd., Yongin-si (KR)

(72) Inventor: Hee-Kwon Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 16/161,008

(22) Filed: Oct. 15, 2018

(65) Prior Publication Data

US 2019/0250734 A1 Aug. 15, 2019

(30) Foreign Application Priority Data

Feb. 14, 2018 (KR) .................. 10-2018-0018514

(51) Int. Cl.
| | | |
|---|---|---|
| G06F 3/044 | (2006.01) | |
| H01L 41/113 | (2006.01) | |
| H01Q 1/24 | (2006.01) | |
| H01Q 5/30 | (2015.01) | |
| G06F 3/041 | (2006.01) | |
| H01L 27/32 | (2006.01) | |
| H05K 9/00 | (2006.01) | |

(Continued)

(52) U.S. Cl.
CPC ............ *G06F 3/044* (2013.01); *G06F 1/1626* (2013.01); *G06F 3/041* (2013.01); *H01L 41/1132* (2013.01); *H01Q 1/243* (2013.01); *H01Q 1/38* (2013.01); *H01Q 5/30* (2015.01); *H04M 1/0266* (2013.01); *H05K 9/0084* (2013.01); *G02F 1/13338* (2013.01); *G06F 2203/04105* (2013.01); *G06F 2203/04107* (2013.01); *H01L 27/323* (2013.01); *H01Q 1/50* (2013.01)

(58) Field of Classification Search
CPC .............. H05K 9/0084; H04M 1/0266; H04M 2250/12; H01Q 9/30; H01Q 5/371; H01Q 5/30; H01Q 5/50; H01Q 5/44; H01Q 5/38; H01Q 5/243; H01L 41/1132; H01L 27/323; H01L 27/3276; G06F 3/044; G06F 3/041; G06F 1/1626; G06F 2203/04105; G06F 2203/04107; G02F 1/13338
See application file for complete search history.

(56) References Cited

U.S. PATENT DOCUMENTS 9,196,958 B2 * 11/2015 Arnold ................. H01Q 1/2283
2010/0096181 A1 * 4/2010 Nakamura ................ B32B 7/02
174/394

(Continued)

FOREIGN PATENT DOCUMENTS

| KR | 10-2015-0120013 | 10/2015 |
| KR | 10-2017-0056450 | 5/2017 |

(Continued)

*Primary Examiner* — Mihir K Rayan
(74) *Attorney, Agent, or Firm* — H.C. Park & Associates, PLC (57) ABSTRACT

A display device includes: a display panel; a shielding layer positioned under the display panel, the shielding layer including a first antenna pattern; a pressure sensor electrode positioned under the shielding layer; an elastic layer positioned under the pressure sensor electrode, the elastic layer including a piezoelectric effect material; and a ground layer positioned under the elastic layer, wherein the pressure sensor electrode, the elastic layer, and the ground layer are configured to operate as a pressure sensor.

17 Claims, 9 Drawing Sheets

(51) Int. Cl.
*H01Q 1/38* (2006.01)
*G06F 1/16* (2006.01)
*H04M 1/02* (2006.01)
H01Q 1/50 (2006.01)
G02F 1/1333 (2006.01)

(56) References Cited

U.S. PATENT DOCUMENTS

| | | | | |
|---|---|---|---|---|
| 2012/0062245 | A1* | 3/2012 | Bao | G01L 1/146 |
| | | | | 324/661 |
| 2016/0065260 | A1* | 3/2016 | Heikura | H04B 1/3838 |
| | | | | 455/575.5 |
| 2016/0156098 | A1* | 6/2016 | Kim | H01Q 1/526 |
| | | | | 343/841 |
| 2018/0294569 | A1* | 10/2018 | Hoang | H01Q 9/0407 |

FOREIGN PATENT DOCUMENTS

| | | |
|---|---|---|
| KR | 10-2017-0095541 | 8/2017 |
| KR | 10-2017-0103159 | 9/2017 |

\* cited by examiner

DISPLAY DEVICE

CROSS-REFERENCE TO RELATED APPLICATION

This application claims priority from and the benefit of Korean Patent Application No. 10-2018-0018514, filed on Feb. 14, 2018, which is hereby incorporated by reference for all purposes as if fully set forth herein.

BACKGROUND

Field

Exemplary embodiments of the invention generally relate to a display device, and more specifically, to a display device applicable to an electronic device with an antenna.

Discussion of the Background

Generally, portable electronic devices such as a smart phone, a tablet PC, a smart watch, and the like include a display device for displaying an image.

The display device provides a condition for a user to conveniently use the portable electronic device through a screen. In addition, the display device includes a camera, a fingerprint sensor, and the like, thus it performs complex functions. Moreover, the display device performs a touch sensing function to facilitate user's convenience.

However, a volume and thickness of the portable electronic device itself increases due to the various functions, which makes slimming of the portable electronic device difficult.

The above information disclosed in this Background section is only for enhancement of understanding of the background of the invention and therefore it may contain information that does not form the prior art that is already known in this country to a person of ordinary skill in the art.

SUMMARY

Devices constructed according to exemplary embodiments of the invention are capable of providing a display device including a pressure sensor and an antenna to reduce the total thickness of the display device.

Additional features of the inventive concepts will be set forth in the description which follows, and in part will be apparent from the description, or may be learned by practice of the inventive concepts.

According to one or more embodiments of the invention, a display device includes: a display panel; a shielding layer positioned under the display panel, the shielding layer including a first antenna pattern; a pressure sensor electrode positioned under the shielding layer; an elastic layer positioned under the pressure sensor electrode, the elastic layer including a piezoelectric effect material; and a ground layer positioned under the elastic layer, wherein the pressure sensor electrode, the elastic layer, and the ground layer are configured to operate as a pressure sensor. The shielding layer and the ground layer may be configured to operated as an antenna, and wherein the shielding layer may include a metal panel of the antenna, and wherein the ground layer may include a ground surface of the antenna.

The display device may further include a printed circuit board (PCB); and an integrated circuit (IC) configured to control the shielding layer and the pressure sensor electrode, wherein the IC may be disposed on the PCB.

The IC may be configured to apply a signal that controls the shielding layer and the pressure sensor electrode.

The IC may be configured to apply a signal of the same frequency band to the shielding layer and the pressure sensor electrode.

The display device may further include a first wire attached to one end of the shielding layer, the first wire configured to operate as a second antenna.

The first antenna pattern and the first wire formed on the shielding layer may include a metal material.

The display device of claim 6, wherein the first antenna pattern and the first wire may be electrically connected to the IC.

The display device of claim 6, wherein the first wire may be configured to transmit and receive a communication signal.

The display device of claim 6, wherein the first antenna pattern and the first wire may be configured to operate as antennas having different frequency bands.

The display device of claim 10, wherein the first antenna pattern may be configured to operate as a first antenna having a frequency band of 900 MHz.

The display device of claim 10, wherein the first wire may be configured to operate as a second antenna having a frequency band of 3.5 GHz.

The display device may further include a second wire attached to one end of the first wire and operating as a third antenna.

The second wire, the first antenna pattern, and the first wire may be electrically connected to the IC.

The second wire may be configured to operate as a third antenna having a frequency band of 1.9 GHz.

The display device may further include a dummy layer positioned on the same layer as the pressure sensor electrode.

The display device may further include a first insulating layer positioned between the shielding layer and the pressure sensor electrode, and a second insulating layer positioned on the ground layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "on a plane" means viewing a target portion from the top, and the phrase "on a cross-section" means viewing a cross-section formed by vertically cutting a target portion from the side.

Figure 1:
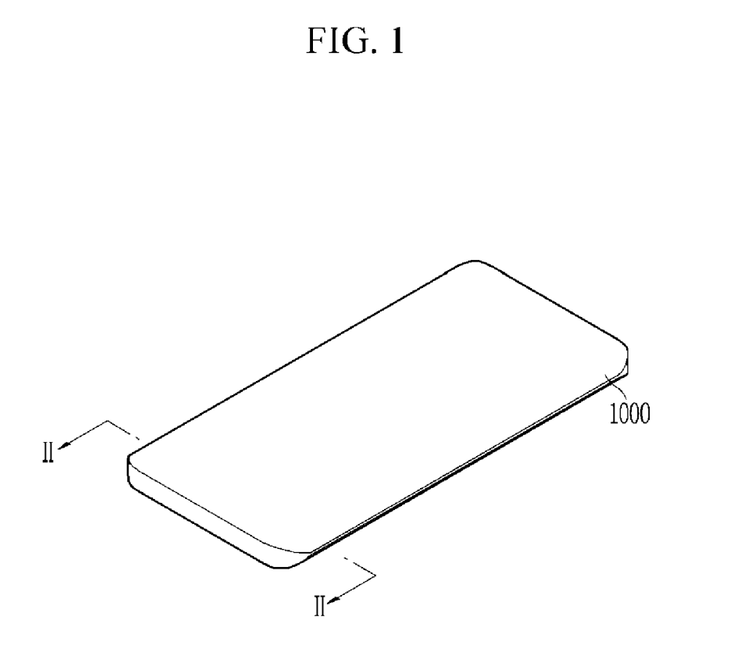
FIG. 1 is a perspective view of a display device according to an exemplary embodiment.
Figure 2:
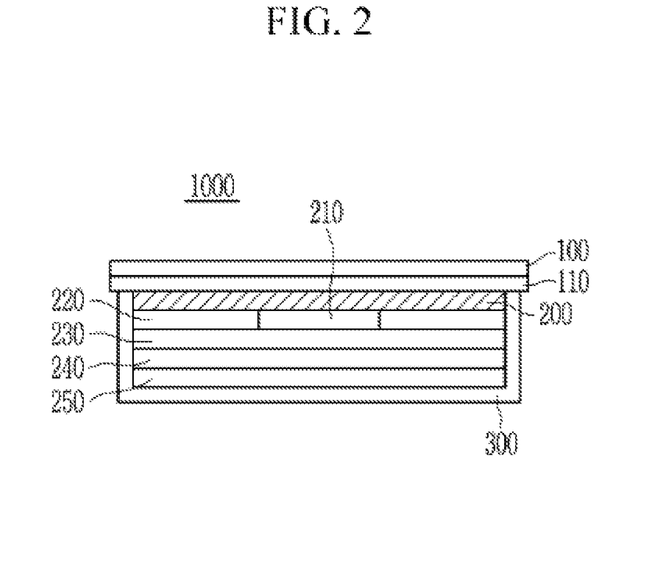
FIG. 2 is a cross-section view taken along a sectional line II-II of FIG. 1.

FIG. 1 is a perspective view of a display device according to an exemplary embodiment, and FIG. 2 is a cross-section view taken along sectional line II-II of FIG. 1.

As shown in FIG. 1, an image display area may be disposed on the entirety of a front surface of a display device 1000 according to an exemplary embodiment. That is, the image display area is disposed on the entire front surface of the display device 1000 without holes or physical buttons. According to exemplary embodiments, the display device 1000 may include image display areas of lateral surfaces in addition to the image display area of the front surface.

Referring to FIG. 2, the display device 1000 according to the exemplary embodiment includes a window 100, a display panel 110, a shielding layer 200, a pressure sensor including a pressure sensor electrode 210, an elastic layer 230, and a ground layer 240, a dummy layer 220, a printed circuit board (PCB) 250, and a bracket 300.

The window 100 is disposed on the display device 1000, and protects components disposed thereunder. The window 100 may include a transparent material to transmit internal light generated inside the display device 1000 to the outside so that an image may be viewed from the outside. The window 100 may be formed of a transparent film, a glass substrate, or a plastic substrate.

The display panel 110 for displaying an image in the display device 1000 is disposed under the window 100. Here, the display panel 110 may include a liquid crystal display (LCD) panel, an organic light-emitting display panel, etc.

A touch sensing panel may be disposed between the window 100 and the display panel 110, and may be integrally formed with the display panel 110.

The shielding layer 200 is disposed under the display panel 110, and is formed on an insulating layer with a conductor including a metal material such as silver (Ag) or the like. The shielding layer 200 is effective in preventing or reducing electric field interference generated in the display panel 110 or the like when electric charges are generated in the pressure sensor to sense pressure. In some exemplary embodiments, a sheet layer including a conductive material may be additionally formed between the display panel 110 and the shielding layer 200.

In addition, the shielding layer 200 according to the exemplary embodiment may include a first antenna pattern. The shielding layer 200 includes a metal material for shielding, but an antenna pattern is formed therein to also serve as an antenna. The antenna pattern may include various patterns according to a signal to be sensed, a design rule, a size of the display device 1000, and the like. According to the exemplary embodiments, the shielding layer 200 may be operated as an antenna having a frequency band of about 900 MHz when a communication signal is applied thereto. The display device 1000 according to the exemplary embodiment may realize slimness thereof by using the shielding layer 200 without a separate antenna structure.

The pressure sensor includes the pressure sensor electrode 210, the elastic layer 230, and the ground layer 240. The pressure sensor may include a pair of electrodes and a piezoelectric effect material positioned therebetween for sensing a pressure, the pressure sensor electrode 210 and the ground layer 240 may correspond to the pair of electrodes, and the elastic layer 230 may include the piezoelectric effect material.

The pressure sensor electrode 210 is positioned under the display panel 110, and is one side electrode of a pressure sensor applied thereto from the outside. The pressure sensor electrode 210 includes a metal material.

According to a comparable mobile phone and the like including physical buttons, the physical buttons are generally positioned at a center of a lower portion thereof. Therefore, the pressure sensor electrode of the comparable mobile phone is generally positioned at a center of a lower portion, which may correspond to line II-II of FIG. 1. According to the exemplary embodiments, the pressure sensor electrode 210 may be variously positioned according to the design change. In addition, a size, a shape, and a number of pressure sensor electrodes 210 may be varied according to the display device 1000.

The elastic layer 230 may be positioned under a layer including the pressure sensor electrode 210. The elastic layer 230 includes an elastic material whose thickness may be reduced by a pressure applied from the outside.

In addition, the elastic layer 230 may serve as a piezoelectric layer for sensing a pressure. Therefore, the elastic layer 230 includes a piezoelectric effect material, and as the piezoelectric effect material, lead zirconate titanate (PZT) or polyvinylidene fluoride (PVDF) may be used. The piezoelectric effect material generates electricity when pressure is applied thereto.

The ground layer 240 is positioned under the elastic layer 230, and may include a conductor such as a metal and the like. The ground layer 240 corresponds to a lower one of the pair of electrodes of the pressure sensor to provide a reference voltage.

In addition, the ground layer 240 operates as an antenna in connection with the shielding layer 200 provided with the first antenna pattern. An antenna requires a metal panel and a ground surface to operate, and therefore, the shielding layer 200 corresponds to the metal panel and the ground layer 240 corresponds to the ground surface. When an antenna signal is applied to the shielding layer 200, the first antenna pattern may transmit and receive a signal based on the ground layer 240.

The dummy layer 220 is positioned at the same layer as the pressure sensor electrode 210, and is formed in an empty space of layers except for where the pressure sensor electrode 210 is located. The dummy layer 220 may include an inorganic insulating material that is not a conductor. In some exemplary embodiments, the dummy layer 220 may be formed to cover layers of an upper portion of the pressure sensor electrode 210.

The printed circuit board 250 is a flexible substrate having an insulating property, and is disposed under the elastic layer 230. The printed circuit board 250 may be implemented as a flexible printed circuit board (FPCB) or a printed circuit board (PCB). The printed circuit board 250 may include a polymer such as a polyimide, and may have a form of a film.

The printed circuit board 250 may have a signal controller for driving the display panel 110 in a chip form having an integrated circuit. In addition, a separate touch sensing portion may be attached in a form of an integrated circuit.

The touch sensing portion may apply a signal for sensing and controlling a signal from the pressure sensor electrode 210 and the shielding layer 200 including the first antenna pattern. In some exemplary embodiments, the signal controller and the touch sensing portion may be formed as a single integrated circuit portion (see reference numeral 251 of FIG. 6).

The bracket 300 may have a shape that surrounds the lateral surface and the lower portion of the display device 1000 to support the lateral surface and the lower portion thereof, and configures a housing together with the window 100.

Although not shown in FIG. 2, respective layers may be attached to each other by an insulating adhesive.

Hereinafter, a structure of the pressure sensor and an operation method thereof will be described with reference to FIG. 3.

Figure 3:
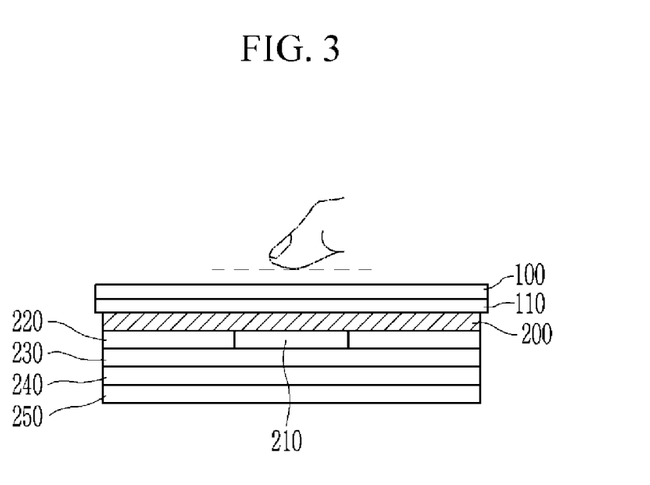
FIG. 3 is a cross-section view illustrating operations of a pressure sensor and a shielding layer according to an exemplary embodiment when a pressure from the outside is applied thereto.

FIG. 3 is a cross-sectional view for explaining operations of the pressure sensor and the shielding layer 200 according to the exemplary embodiment when pressure is applied thereto from the outside.

As shown in FIG. 3, when a user presses the display device 1000 at a top of the window 100, a thickness of the elastic layer 230 is changed.

In response to the thickness of the elastic layer 230 being changed, electrostatic capacitance between the pressure sensor electrode 210 and the ground layer 240 is changed. The pressure sensor electrode 210 and the elastic layer 230 sense the change of the capacitance to determine whether there is a pressure, thereby activating the display device 1000.

An electric field is generated in response to a charge formed on the pressure sensor electrode 210, and the electric field generated by the charge formed on the pressure sensor electrode 210 may cause a problem of signal interference in the display panel 110 configured to continuously display images. According to the exemplary embodiment, the shielding layer 200 may reduce the signal interference formed in the display panel 110.

The shielding layer 200 includes a metal material for shielding, and an antenna pattern to serve as an antenna is formed therein.

On the other hand, when parasitic capacitance is generated between a sheet layer positioned under the display panel 110, and the shielding layer 200, the pressure sensing may be affected. Accordingly, the shielding layer 200 receives a signal in a frequency band of about 800 KHz, which is the same frequency band as that of a signal applied to the pressure sensor electrode 210, so that the pressure sensor electrode 210 may accurately sense the pressure.

Hereinafter, some components of the display device 1000 shown in the exploded perspective view of FIG. 4 will be described.

Figure 4:
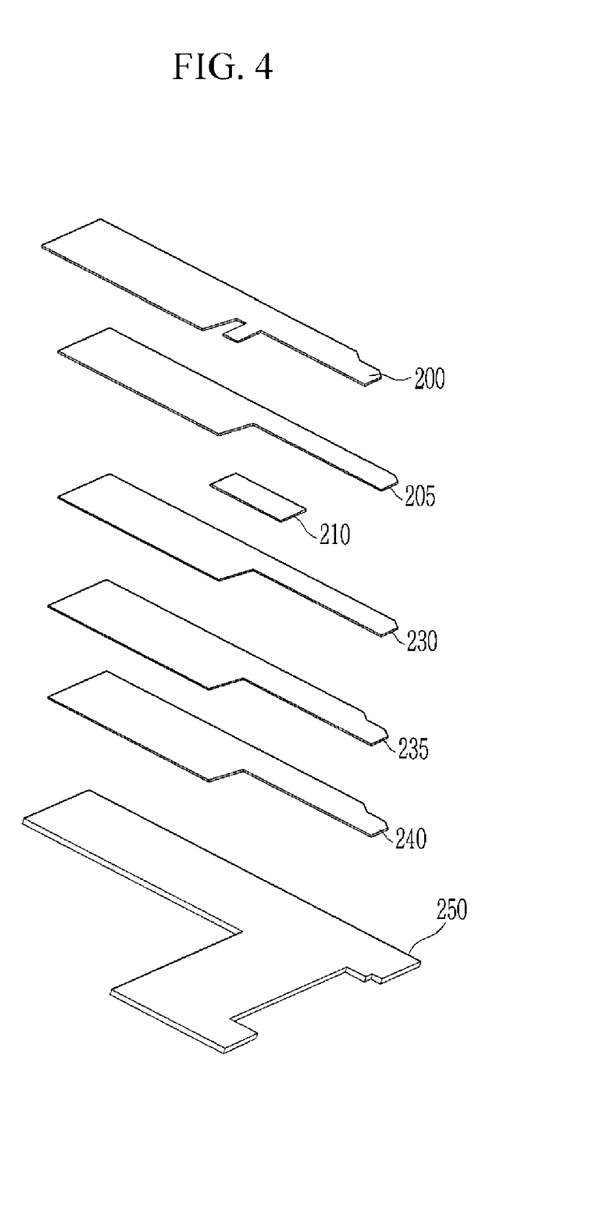
FIG. 4 is an exploded perspective view of a shielding layer, a pressure sensor electrode, an elastic layer, and a ground layer according to an exemplary embodiment.

FIG. 4 is an exploded perspective view of the shielding layer 200, the pressure sensor electrode 210, the elastic layer 230, and the ground layer 240 according to the exemplary embodiment.

Compared to the exemplary embodiment of FIG. 2, the exemplary embodiment of FIG. 4 further includes a first insulating layer 205 and a second insulating layer 235.

Referring to FIG. 4, the present exemplary embodiment includes the shielding layer 200, the first insulating layer 205, the pressure sensor electrode 210, the elastic layer 230, the second insulating layer 235, the ground layer 240, and the printed circuit board 250.

The shielding layer 200 is a conductor disposed on an insulating layer, and is formed to have a quadrangular shape having a length longer than a width thereof. The shielding layer 200 includes a first portion having a wide width and a second portion having a narrow width with respect to a longitudinal axis, a protrusion positioned between the first portion and the second portion, and a groove formed between the protrusion and the first portion.

The first insulating layer 205 is positioned under the shielding layer 200, and similar to the shielding layer 200, it is formed to have a quadrangular shape having a length longer than a width thereof. The first insulating layer 205 includes a first portion having a wide width and a second portion having a narrow width with respect to a longitudinal axis, which respectively correspond to the first portion and the second portion of the shielding layer 200.

The pressure sensor includes the pressure sensor electrode 210, the elastic layer 230, and the ground layer 240, and the pressure sensor electrode 210.

The pressure sensor electrode 210 corresponds to an upper electrode of the pressure sensor, and is positioned under the first insulating layer 205. The pressure sensor electrode 210 has a quadrangular shape of which length is longer than a width thereof.

The pressure sensor electrode 210 is positioned at a lower center of the first portion and the second portion of the first insulating layer 205 when the directions of the longitudinal axes thereof are the same. At least a part of the pressure sensor electrode 210 is not covered with the first insulating layer 205 and exposed. For example, the lower portion of the first portion of the first insulating layer 205 may overlap half of the pressure sensor electrode 210, and the lower portion of the second portion of the first insulating layer 205 may overlap to the remaining half of the pressure sensor electrode 210.

In addition to the exemplary embodiment, the pressure sensor electrode 210 may be variously positioned under the first insulating layer 205 depending on a size and a number of the pressure sensor electrodes 210.

The elastic layer 230 includes a piezoelectric effect material of the pressure sensor, and is positioned under the pressure sensor electrode 210. The elastic layer 230 includes a first portion corresponding to the first portion of the first insulating layer 205 and a second portion corresponding to the second portion of the first insulating layer 205, thereby having a structure similar to the structure of the first insulating layer 205.

The first portion of the elastic layer 230 may overlap the lower portion of the pressure sensor electrode 210 to correspond to the first portion of the first insulating layer 205 positioned on the pressure sensor electrode 210, and the second portion of the elastic layer 230 may overlap the lower portion of the pressure sensor electrode 210 to correspond to the second portion of the first insulating layer 205.

The ground layer 240 corresponds to the lower electrode of the pressure sensor, and is positioned under the elastic layer 230. Similar to the elastic layer 230, the ground layer 240 has a structure including a first portion and a second portion, and the ground layer 240 may overlap the lower portion of the elastic layer 230 to correspond to the first portion and the second portion of the elastic layer 230.

The second insulating layer 235 is positioned between the elastic layer 230 and the ground layer 240, and has a long quadrangular shape like the elastic layer 230. The second insulating layer 235 includes a first portion having a wide width and a second portion having a narrow width with respect to a longitudinal axis, and may overlap the lower portion of the elastic layer 230 to correspond to the first portion and the second portion of the elastic layer 230.

Herein, the first insulating layer 205 is formed between the shielding layer 200 and the pressure sensor electrode 210 to prevent a short circuit due to change of a charge generated between the pressure sensor electrode 210 and the shielding layer 200, and it may be formed with a polyethylene terephthalate (PET) film or the like.

The second insulating layer 235 is positioned between the elastic layer 230 and the ground layer 240, and prevents a short circuit due to capacitance change between the pressure sensor electrode 210 and the ground layer 240 when a pressure is sensed. Similar to the first insulating layer 205, second insulating layer 235 may be formed with a PET film or the like.

The printed circuit board 250 is positioned under the ground layer 240, and includes a first quadrangular portion whose length is longer than a width thereof and a second quadrangular portion of which length and width are similar. In addition, the printed circuit board 250 includes a protrusion slightly protruded from a lateral surface with respect to the second quadrangular portion.

An integrated circuit portion (see reference numeral 251 of FIG. 6) for sensing and controlling signals from the pressure sensor electrode 210 and the shielding layer 200 may be attached to the second quadrangular portion of the printed circuit board 250.

In addition, a communication port for applying a communication signal or the like may be disposed at the protrusion provided at the lower lateral surface of the second quadrangular portion of the printed circuit board 250.

The first quadrangular portion of the printed circuit board 250 overlaps the first portion of the ground layer 240 to correspond thereto. The second quadrangular portion of the printed circuit board 250 overlaps the lower portion of the second portion of the ground layer 240, but its shape does not correspond to the shape of the second portion, and the second quadrangular portion has a larger area than the second portion. Thus, a space for forming the integrated circuit 251 in the printed circuit board 250 may be secured.

The printed circuit board 250 may have a larger area than the plurality of layers positioned thereon, and the shielding layer 200, the first insulating layer 205, the elastic layer 230, the second insulating layer 235, the ground layer 240, and the printed circuit board 250 that are sequentially stacked may be respectively formed to have various shapes, for example, various lengths, widths, and areas in some exemplary embodiments.

Hereinafter, a structure of an antenna will be described with reference to FIG. 5.

Figure 5:
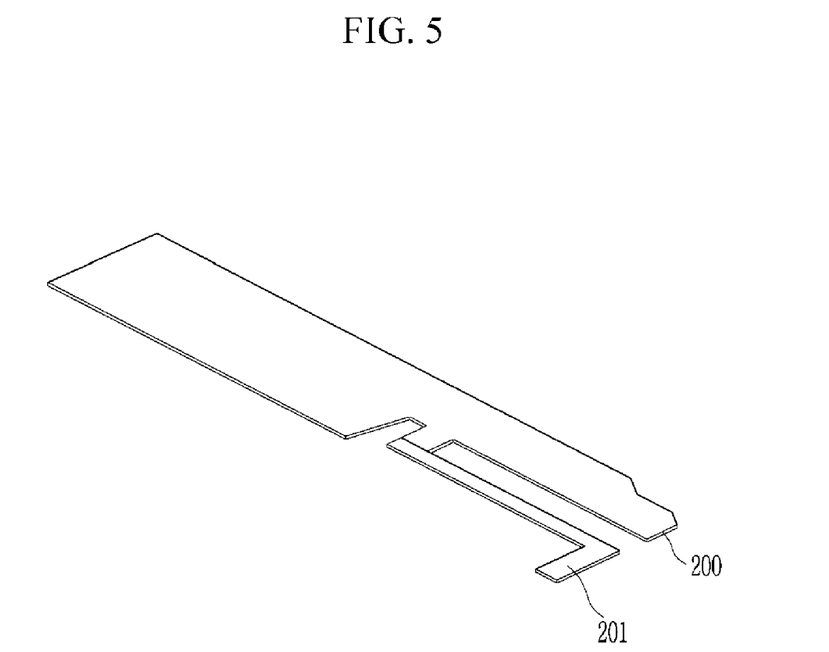
FIG. 5 is a perspective view of a shielding layer to which a first wire is attached and that is realized with an antenna according to an exemplary embodiment.

FIG. 5 is a perspective view of a shielding layer 200 to which a first wire 201 is attached and that is realized with an antenna according to an exemplary embodiment.

Referring to FIG. 5, an antenna according to the exemplary embodiment includes the shielding layer 200 and the first wire 201.

The shielding layer 200 includes a metal material such as silver (Ag), and includes a first antenna pattern. The shielding layer 200 includes a first portion having a wide width and a second portion having a narrow width with respect to a longitudinal axis, and a protrusion positioned between the first portion and the second portion.

The first wire 201 includes a metal material such as copper (Cu), and operates as a second antenna. The first wire 201 includes a linear portion and a protrusion bent at one end of the linear portion, and may be formed to have various lengths and thicknesses according to a communication frequency band.

The linear portion of the first wire 201 is attached to the protrusion of the shielding layer 200 and is parallel to the longitudinal axis of the shielding layer 200. In this case, the protrusion of the first wire 201 may be attached opposite to or facing away from the shielding layer 200.

The first wire 201 may be attached to the shielding layer 200 using an anisotropic conductive film or the like. In some exemplary embodiments, the first wire 201 may be manufactured through the same process as the shielding layer 200.

Hereinafter, a connection wire of the antenna will be described with reference to FIG. 6.

Figure 6:
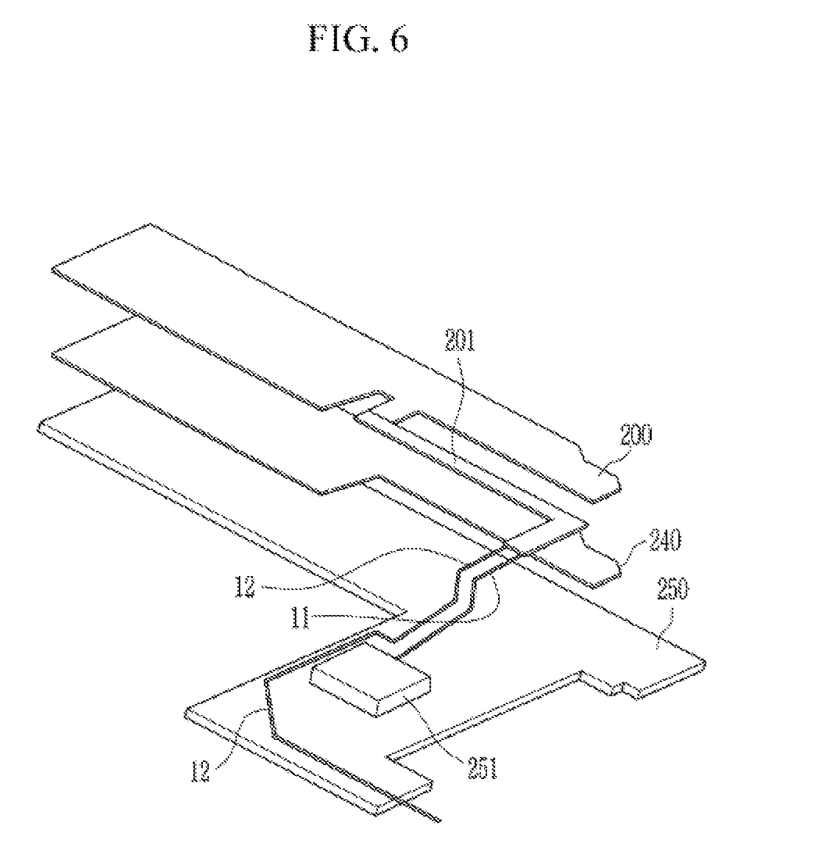
FIG. 6 is a perspective view in which a ground layer, a printed circuit board (PCB), and a connection wire are added to the exemplary embodiment of FIG. 5.

FIG. 6 is a perspective view in which the ground layer 240, the printed circuit board 250, and the connection wire are added to the exemplary embodiment of FIG. 5.

In the display device 1000, an antenna performs a communication function as a module such as a Wi-Fi, Bluetooth, and RF antenna. The antenna according to the exemplary embodiment may be realized as a planar inverted-F antenna (PIFA) to perform an RF antenna function.

The planar inverted-F antenna is realized by the shielding layer 200, the first wire 201, and the ground layer 240. Accordingly, the exemplary embodiment illustrated in FIG. 6 includes the shielding layer 200, the first wire 201, the ground layer 240, a first connection line 11, a second connection line 12, and the printed circuit board 250.

The shielding layer 200 is formed of a conductor, and includes the first antenna pattern. The shielding layer 200 including a metal patch of the antenna is configure to transmit a signal to or receives a signal from the outside. Since the antenna according to the exemplary embodiment is not provided with a separate metal patch but uses the shielding layer 200, the slimness of the display device 1000 may be realized.

The first wire 201 includes a metal material attached to the shielding layer 200, and operates as the second antenna. The first wire 201 may have a rectangular shape with a long length and a small quadrangular shape bent at one end of the rectangular shape with the long length. The first wire 201 is attached to the shielding layer 200 to form a single metal patch of the antenna together with the shielding layer 200.

The ground layer 240 is positioned under the shielding layer 200, and is parallel to the shielding layer 200. Herein, the ground layer 240 serves as a ground surface of the antenna. The ground surface may increase a band of the antenna according to reduction of an area to be grounded, and in some exemplary embodiments, the area of the ground layer 240 may be changed.

The printed circuit board 250 is positioned under the ground layer 240, and the shielding layer 200 including the first antenna pattern and the integrated circuit 251 for sensing and controlling signals from the first wire 201 are attached to the printed circuit board 250.

The shielding layer 200 and the first wire 201 are electrically connected to the integrated circuit 251 of the printed circuit board 250 through the first connection line 11.

The first connection line 11 supplies power to the first wire 201 and the shielding layer 200. The integrated circuit 251 to which the first connection line 11 is connected is connected to a power supply for supplying power to the display device 1000.

The second connection line 12 applies a communication signal to the shielding layer 200 including the first wire 201 and the first antenna pattern. The second connection line 12 may be connected to the first wire 201 to transmit or receive a communication signal.

A current supplied through the first connection line 11 flows through the first wire 201 and the shielding layer 200, and a signal is received by an electric field generated in this case. In addition, the first wire 201 and the shielding layer 200 operate as antennas having different frequency bands according to a communication signal applied through the second connection line 12.

When the shielding layer 200 operates as the antenna, the shielding layer 200 receives a signal of a predetermined frequency band regardless of whether an electric field of the pressure sensor electrode 210 is generated. This is because the signal received from the shielding layer 200 may be selected and extracted from a signal processor, so it is possible to transmit and receive a signal without any problem when a pressure is sensed.

Figure 7:
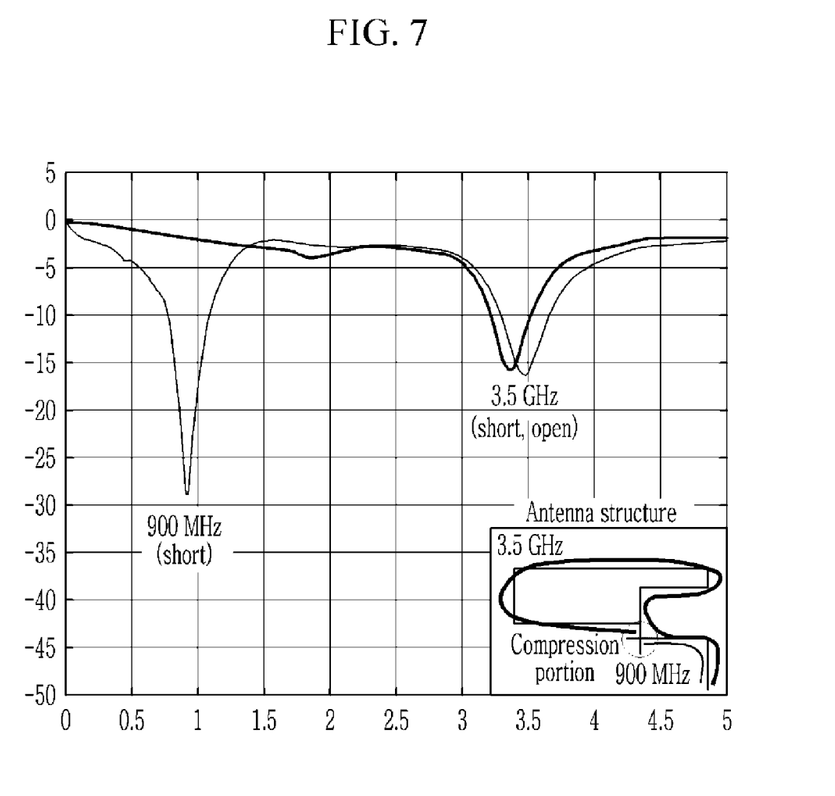
FIG. 7 is a performance test evaluation graph of an antenna according to an exemplary embodiment.

Referring to FIG. 7, frequency bands of the antenna according to an exemplary embodiment can be confirmed.

FIG. 7 is a performance test evaluation graph of an antenna according to an exemplary embodiment.

In the case in which the shielding layer 200 receives the signal from the second connection line 12 through the first wire 201, since an area in which the shielding layer 200 overlaps the ground layer 240 is wide, the signal may be a signal in a low frequency band. As shown in the graph of FIG. 7, it can be confirmed that the first antenna pattern of the shielding layer 200 operates as antenna having a low frequency band of 900 MHz.

Referring to a frequency band according to a pattern formed on the first wire 201, since an area in which the first wire 201 overlapping the ground layer 240 is small, a signal in a high frequency band may be transmitted and received by the first wire 201. As shown in the graph of FIG. 7, it can be confirmed that the first wire 201 operated as an antenna of a high frequency band of 3.5 GHz.

Hereinafter, a connection wire, which is added to the exemplary embodiment of FIG. 5, between the pressure sensor and antenna and the substrate, will be described with reference to FIG. 8.

Figure 8:
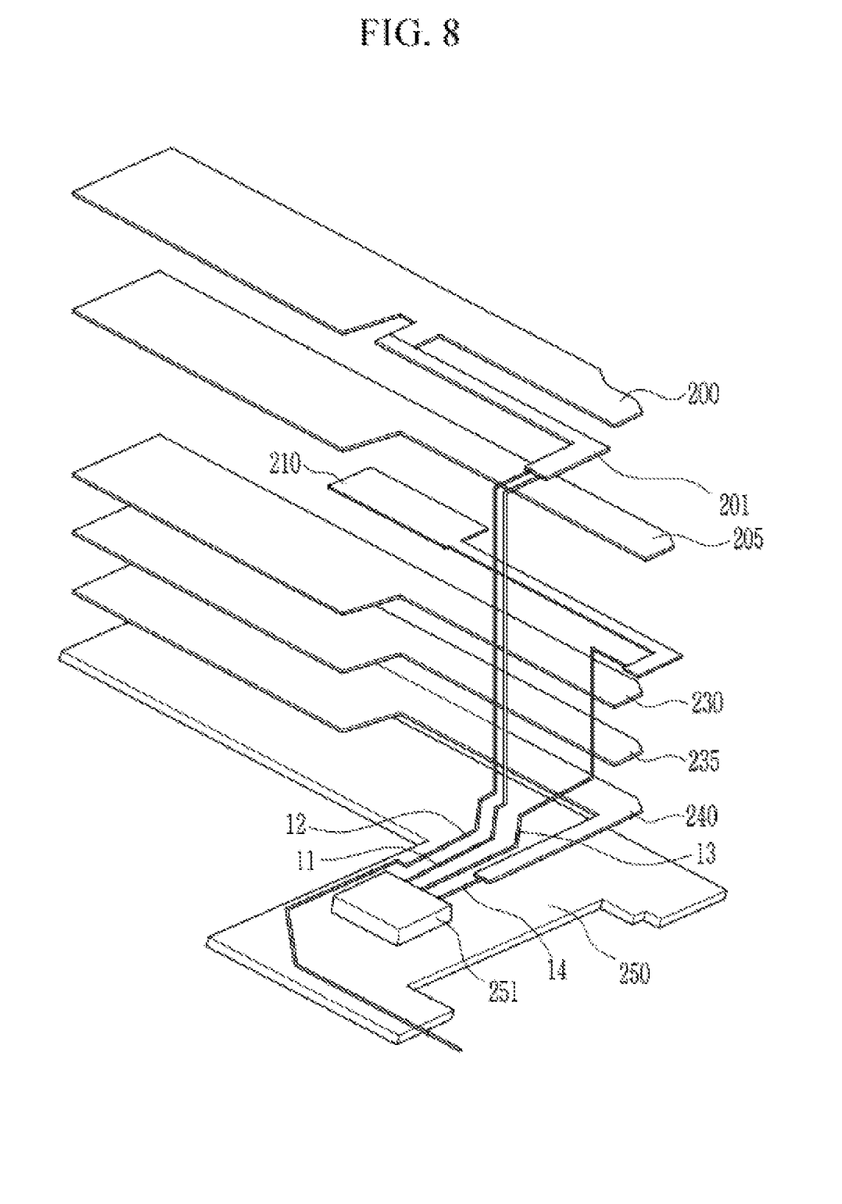
FIG. 8 is an exploded perspective view of a connection wire, which is added to the exemplary embodiment of FIG. 5, between a pressure sensor and an antenna, and a substrate.

FIG. 8 is an exploded perspective view of a connection wire, which is added to the exemplary embodiment of FIG. 5, between a pressure sensor and an antenna, and a substrate.

The pressure sensor may include the pressure sensor electrode 210, the elastic layer 230, and the ground layer 240, and the antenna may include the shielding layer 200 and the ground layer 240.

FIG. 8 is the shielding layer 200, the first wire 201, the first insulating layer 205, the pressure sensor electrode 210, the elastic layer 230, the second insulating layer 235, the ground layer 240, the printed circuit board 250, and the integrated circuit 251. In addition, the first connection line 11, the second connection line 12, a third connection line 13, and a fourth connection line 14 are illustrated in FIG. 8.

The shielding layer 200 is formed with a conductor on the insulating layer, and includes the first antenna pattern. The shielding layer 200 may effectively work to prevent or reduce electric field interference generated in the display panel 110 or the like when the pressure sensor operates.

In addition, since the shielding layer 200 may operate as the antenna having the frequency band of 900 MHz when a communication signal is applied thereto, and the display device 1000 may maintain a slim thickness without including a separate antenna structure.

The first wire 201 includes a metal material, and operates as the second antenna. The first wire 201 may be attached to the protrusion of the shielding layer 200, and may operate as the antenna of the high frequency band of 3.5 GHz when a communication signal is applied thereto.

The first insulating layer 205 is positioned under the shielding layer 200, and is disposed to prevent a short circuit in the shielding layer 200 due to a charge change of the pressure sensor.

The pressure sensor electrode 210 is an electrode for sensing pressure together with the elastic layer 230 and the ground layer 240. The pressure sensor electrode 210 has a small rectangular shape positioned at a lower center of the first insulating layer 205, and an extension extending to the right side from the small rectangular shape.

The extension of the pressure sensor electrode 210 is electrically connected to the integrated circuit 251 provided at the printed circuit board 250 through the third connection line 13. The integrated circuit 251 receives the electric signal sensed by the pressure sensor electrode 210, and may activate the display device 1000 when a signal of a predetermined intensity is sensed.

The elastic layer 230 may be positioned under the pressure sensor electrode 210. The elastic layer 230 may include an elastic material of which thickness may be reduced by a pressure applied from the outside and a piezoelectric material for sensing pressure.

The ground layer 240 is positioned under the elastic layer 230, and provides a reference electrode corresponding to a lower one of a pair of electrodes of the pressure sensor.

In addition, the ground layer 240 is disposed to be parallel to the shielding layer 200, and serves as a ground surface of the antenna when the display device 1000 operates as the antenna. The ground surface may increase a band of the antenna according to reduction of an area to be grounded.

The second insulating layer 235 is positioned between the elastic layer 230 and the ground layer 240, and prevents a short circuit due to capacitance change between the pressure sensor electrode 210 and the ground layer 240 when a pressure is sensed.

The printed circuit board 250 is positioned under the ground layer 240, and includes a first portion whose length is longer than a width thereof and a second portion of which length and width are similar. The integrated circuit for sensing and controlling signals from the pressure sensor electrode 210 and the shielding layer 200 may be attached to the second portion of the printed circuit board 250.

The ground layer 240 has a long quadrangular shape and a narrow quadrangular extension bent at a predetermined angle at one end of the long quadrangular shape. The extension of the ground layer 240 is connected to the integrated circuit 251 of the printed circuit board 250 through the fourth connection line 14. Accordingly, the integrated circuit 251 may be electrically connected to a ground portion embedded in the printed circuit board 250 to become a ground electrode.

Hereinafter, an antenna according to an exemplary embodiment will be described with reference to FIG. 9.

Figure 9:
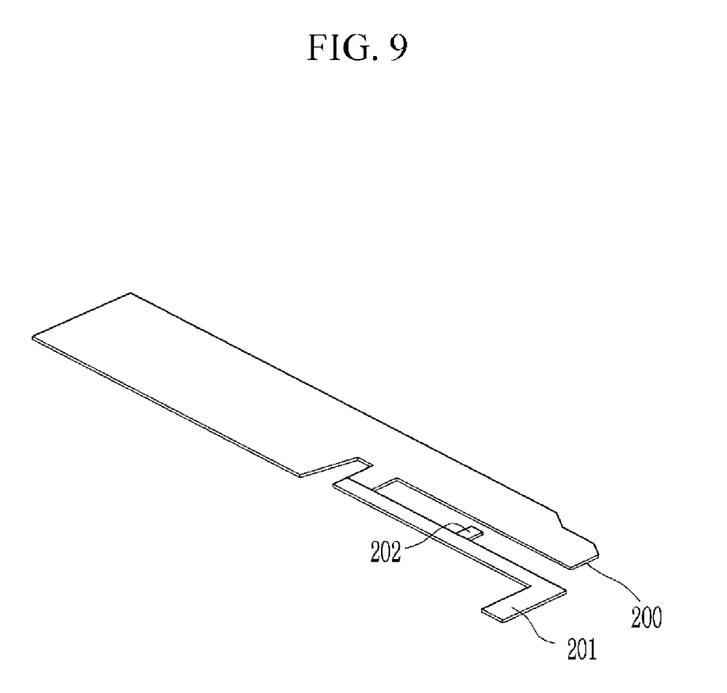
FIG. 9 is a perspective view of a shielding layer to which first and second wires realized as an antenna according to another exemplary embodiment are attached.

FIG. 9 is a perspective view of a shielding layer 200 to which a first wire 201 and a second wire 202 that are realized as an antenna according to the exemplary embodiment are attached.

Referring to FIG. 9, an antenna according to the exemplary embodiment includes the shielding layer 200, the first wire 201, and the second wire 202.

The shielding layer 200 includes a metal material such as silver (Ag), and includes the first antenna pattern. The shielding layer 200 is formed of a long quadrangular shape including a first portion having a wide width and a second portion having a narrow width with respect to a longitudinal axis and a protrusion positioned between the first portion and the second portion.

The first wire 201 includes a metal material such as copper (Cu), and operates as the second antenna. The first wire 201 includes a long linear portion and a protrusion bent at one end of the linear portion, and may be formed to have various lengths and thicknesses according to a communication frequency band.

The linear portion of the first wire 201 is attached to the protrusion of the shielding layer 200 and is parallel to the longitudinal axis of the shielding layer 200. In this case, the protrusion of the first wire 201 may be attached so as to be directed in the same direction as the protrusion of the shielding layer 200.

The second wire 202 includes a metal material, and operates as a third antenna. The second wire 202 includes the linear portion of which length and width are similar, and may be formed to have various lengths and thicknesses according to a communication frequency band.

The second wire 202 is disposed in a direction opposite to the protrusion of the first wire 201, and is attached to one point of the linear portion of the first wire 201. The second wire 202 may be attached to the first wire 201 using an anisotropic conductive film or the like.

The second wire 202 is electrically connected to the integrated circuit 251 together with the first wire 201 and the shielding layer 200 having the first antenna pattern formed thereon. (See the first connection line 11 of FIG. 8)

The second wire 202 is included in the shielding layer 200, and may operate as a planar inverted-F antenna together with the shielding layer 200 and the first wire 201.

The second wire 202 operating as the third antenna may transmit and receive a signal of a frequency band of about 1.9 GHz according to a signal applied from the signal controller. In some exemplary embodiments, by additionally attaching the metal wire to the linear portion of the second wire 202, it is possible to utilize signals of various frequency bands.

According to the exemplary embodiment, it is possible to realize the pressure sensor and the display device 1000 capable of performing a communication function by forming the first antenna pattern on the shielding layer 200 and adding the first wire 201 and the second wire 202.

According to the embodiment, a display device may utilize a shielding layer of a pressure sensor as an antenna structure capable of transmitting and receiving a signal, thereby reducing a processing time and cost for manufacturing an additional antenna.

In addition, slimness of a display device may be realized with a simple structure in which a pressure sensor and an antenna are integrally formed.

Therefore, since it is unnecessary to include a separate antenna for a display device, it is possible to realize a slim display device with a simple structure in which a process time and cost thereof are reduced and a pressure sensor and an antenna are integrally formed.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
a shielding layer positioned under the display panel, the shielding layer comprising a first antenna pattern;
a pressure sensor electrode positioned under the shielding layer;
an elastic layer positioned under the pressure sensor electrode, the elastic layer comprising a piezoelectric effect material; and
a ground layer positioned under the elastic layer,
wherein the pressure sensor electrode, the elastic layer, and the ground layer are configured to operate as a pressure sensor.

2. The display device of claim 1, wherein
the shielding layer and the ground layer are configured to operated as an antenna, and
wherein the shielding layer comprises a metal panel of the antenna, and
wherein the ground layer comprises a ground surface of the antenna.

3. The display device of claim 1, further comprising
a printed circuit board (PCB); and
an integrated circuit (IC) configured to control the shielding layer and the pressure sensor electrode,
wherein the IC is disposed on the PCB.

4. The display device of claim 3, wherein
the IC is configured to apply a signal that controls the shielding layer and the pressure sensor electrode.

5. The display device of claim 4, wherein
the IC is configured to apply a signal of the same frequency band to the shielding layer and the pressure sensor electrode.

6. The display device of claim 1, further comprising
a first wire attached to one end of the shielding layer, the first wire configured to operate as a second antenna.

7. The display device of claim 6, wherein
the first antenna pattern and the first wire formed on the shielding layer comprise a metal material.

8. The display device of claim 6, wherein
the first antenna pattern and the first wire are electrically connected to an integrated circuit (IC).

9. The display device of claim 6, wherein
the first wire is configured to transmit and receive a communication signal.

10. The display device of claim 6, wherein
the first antenna pattern and the first wire are configured to operate as antennas having different frequency bands.

11. The display device of claim 10, wherein
the first antenna pattern is configured to operate as a first antenna having a frequency band of 900 MHz.
12. The display device of claim 10, wherein
the first wire is configured to operate as a second antenna having a frequency band of 3.5 GHz.
13. The display device of claim 7, further comprising
a second wire attached to one end of the first wire and operating as a third antenna.
14. The display device of claim 13, wherein
the second wire, the first antenna pattern, and the first wire are electrically connected to an integrated circuit (IC).
15. The display device of claim 13, wherein
the second wire is configured to operate as a third antenna having a frequency band of 1.9 GHz.
16. The display device of claim 1, further comprising
a dummy layer positioned on the same layer as the pressure sensor electrode.
17. The display device of claim 16, further comprising
a first insulating layer positioned between the shielding layer and the pressure sensor electrode, and
a second insulating layer positioned on the ground layer.

* * * * *